United States Patent
Kim et al.

(10) Patent No.: US 9,281,048 B2
(45) Date of Patent: Mar. 8, 2016

(54) SEMICONDUCTOR MEMORY DEVICE CAPABLE OF PREVENTING NEGATIVE BIAS TEMPERATURE INSTABILITY (NBTI) USING SELF REFRESH INFORMATION

(71) Applicant: SAMSUNG ELECTRONICS CO., LTD., Suwon-si, Gyeonggi-do (KR)

(72) Inventors: Byung-Chul Kim, Suwon-si (KR); Yang-Ki Kim, Seoul (KR); Seong-Hwan Jeon, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/325,852

(22) Filed: Jul. 8, 2014

(65) Prior Publication Data
US 2015/0155029 A1    Jun. 4, 2015

(30) Foreign Application Priority Data
Nov. 29, 2013  (KR) .......................... 10-2013-0147753

(51) Int. Cl.
| G11C 7/00 | (2006.01) |
| G11C 11/406 | (2006.01) |
| G11C 11/4076 | (2006.01) |
| G11C 11/4067 | (2006.01) |
| G11C 7/04 | (2006.01) |

(52) U.S. Cl.
CPC ............ *G11C 11/40615* (2013.01); *G11C 7/04* (2013.01); *G11C 11/406* (2013.01); *G11C 11/4067* (2013.01); *G11C 11/4076* (2013.01); *G11C 2207/104* (2013.01); *G11C 2211/4065* (2013.01)

(58) Field of Classification Search
CPC ........... G11C 11/406; G11C 11/40615; G11C 11/4076; G11C 2211/4067; G11C 7/222
USPC .................... 365/222, 189.011, 230.06, 233.1
See application file for complete search history.

(56) References Cited

U.S. PATENT DOCUMENTS

| 7,023,749 | B2 | 4/2006 | Hasegawa et al. |
| 7,948,261 | B2 | 5/2011 | Kawakami |
| 8,062,962 | B2 | 11/2011 | Kaczer et al. |
| 2007/0189096 | A1* | 8/2007 | Lee ..................... G11C 7/1063 365/222 |
| 2010/0046276 | A1 | 2/2010 | Chen et al. |
| 2010/0102872 | A1 | 4/2010 | Wu et al. |

* cited by examiner

*Primary Examiner* — Fernando Hidalgo
(74) *Attorney, Agent, or Firm* — F. Chau & Associates, LLC

(57) ABSTRACT

A semiconductor memory device that includes a command decoder, a refresh controller, an oscillator and a delay unit. The command decoder generates a self refresh command, and the oscillator generates an oscillation signal. The refresh controller generates a refresh control signal and a recovery signal in response to the self refresh command and the oscillation signal. The delay unit transitions internal nodes included in the delay unit that are not transitioned during a refresh period in response to the refresh control signal and the recovery signal.

20 Claims, 11 Drawing Sheets

US 9,281,048 B2

SEMICONDUCTOR MEMORY DEVICE CAPABLE OF PREVENTING NEGATIVE BIAS TEMPERATURE INSTABILITY (NBTI) USING SELF REFRESH INFORMATION

CROSS-REFERENCE TO RELATED APPLICATION

This application claims priority under 35 U.S.C. §119 to Korean Patent Application No. 10-2013-0147753 filed on Nov. 29, 2013, the disclosure of which is incorporated by reference herein in its entirety.

TECHNICAL FIELD

Exemplary embodiments of the inventive concept relate to a semiconductor memory device, and more particularly, to a semiconductor memory device capable of preventing negative bias temperature instability (NBTI) using self refresh information.

DISCUSSION OF THE RELATED ART

In a semiconductor memory device, such as a dynamic random access memory (DRAM) device, a negative bias may become unstable due to a temperature change that occurs when a high electric field is applied to gates of p-channel metal-oxide-semiconductor (PMOS) transistors included in the semiconductor memory device. This phenomenon is referred to as negative bias temperature instability (NBTI). When the NBTI is generated, a threshold voltage of a PMOS transistor increases and performance of the semiconductor memory device may be degraded.

SUMMARY

Exemplary embodiments of the inventive concept provide a semiconductor memory device capable of preventing negative bias temperature instability (NBTI) using self refresh information.

In accordance with an exemplary embodiment of the inventive concept, a semiconductor memory device may include a command decoder configured to generate a self refresh command, an oscillator configured to generate an oscillation signal, a refresh controller configured to generate a refresh control signal and a recovery signal in response to the self refresh command and the oscillation signal, and a delay unit configured to transition internal nodes included in the delay unit that are not transitioned during a refresh period, in response to the refresh control signal and the recovery signal.

In an exemplary embodiment of the inventive concept, the refresh control signal may not be transitioned during the refresh period.

In an exemplary embodiment of the inventive concept, the refresh control signal and the recovery signal may be generated in a self refresh mode.

In an exemplary embodiment of the inventive concept, the delay unit may include a plurality of delay segments each having internal nodes that transition in response to the refresh control signal and the recovery signal.

In an exemplary embodiment of the inventive concept, each of the plurality of delay segments may electrically connect one of its internal nodes to a ground voltage during the refresh period.

In an exemplary embodiment of the inventive concept, each of the plurality of delay segments may electrically connect an internal node located near an input terminal to a ground voltage during the refresh period.

In an exemplary embodiment of the inventive concept, each of the plurality of delay segments may include a plurality of inverters connected to each other in a chain form, a plurality of p-channel metal-oxide-semiconductor (PMOS) transistors, a plurality of n-channel metal-oxide-semiconductor (NMOS) transistors, and a first switch. Each of the plurality of PMOS transistors is connected to a supply voltage and each of the inverters, and performs a switching operation in response to a first refresh control signal. Each of the plurality of NMOS transistors is connected to a ground voltage and each of the inverters, and performs a switching operation in response to a second refresh control signal. The first switch may transition some internal nodes located between the inverters in response to the recovery signal.

In an exemplary embodiment of the inventive concept, the first switch includes an NMOS transistor connected between one internal node located between the inverters and the ground voltage, and configured to perform a switching operation in response to the recovery signal.

In an exemplary embodiment of the inventive concept, the first refresh control signal and the second refresh control signal may have opposite phases with respect to each other.

In an exemplary embodiment of the inventive concept, the recovery signal may have the same phase as the first refresh control signal.

In accordance with an exemplary embodiment of the inventive concept, a semiconductor memory device may include a command decoder configured to generate a self refresh command, an oscillator configured to generate an oscillation signal, a refresh controller configured to generate a refresh control signal in response to the self refresh command and the oscillation signal, and a delay unit a delay unit configured to transition internal nodes included in the delay unit that are not transitioned during a refresh period, in response to the refresh control signal.

In an exemplary embodiment of the inventive concept, the delay unit may perform a power gating operation in response to the refresh control signal in the refresh period.

In an exemplary embodiment of the inventive concept, the delay unit may include a plurality of delay segments each having internal nodes that transition in response to the refresh control signal.

In an exemplary embodiment of the inventive concept, each of the plurality of delay segments may include a plurality of inverters connected to each other in a chain form, a plurality of PMOS transistors, a plurality of NMOS transistors, and a first switch. Each of the plurality of PMOS transistors is connected to a supply voltage and each of the inverters, and performs a switching operation in response to a first refresh control signal. Each of the plurality of NMOS transistors is connected to a ground voltage and each of the inverters, and performs a switching operation in response to a second refresh control signal. The first switch may transition some internal nodes located between the inverters in response to the first refresh control signal.

In an exemplary embodiment of the inventive concept, the first switch includes an NMOS transistor connected between one internal node located between the inverters and the ground voltage, and configured to perform a switching operation in response to the first refresh control signal.

In accordance with an exemplary embodiment of the inventive concept, a semiconductor memory device may include: a refresh controller configured to generate a refresh control signal and a recovery signal in response to a self refresh command and an oscillation signal; and a delay unit configured to electrically connect at least one of its internal nodes to a ground voltage in response to the recovery signal during a refresh period.

The delay unit may include a plurality of inverters including PMOS transistors.

The refresh control signal may include a first refresh control signal and a second refresh control signal having different phases from each other.

The first refresh control signal may be input to PMOS transistors of the delay unit and the second refresh control signal may be input to NMOS transistors of the delay unit.

The internal node that is connected to the ground voltage may be disposed between a pair of inverters of the delay unit.

BRIEF DESCRIPTION OF THE DRAWINGS

The foregoing and other features of the inventive concept will become more apparent by describing in detail exemplary embodiments thereof with reference to the accompanying drawings in which.

DETAILED DESCRIPTION OF THE EMBODIMENTS

Exemplary embodiments of the inventive concept will now be described more fully below with reference to the accompanying drawings. The inventive concept may, however, be embodied in many alternate forms and should not be construed as limited to the exemplary embodiments set forth herein.

It will be understood that when an element is referred to as being "connected" or "coupled" to another element, it can be directly connected or coupled to the other element or intervening elements may be present.

As used herein, the singular forms "a," "an," and "the" are intended to include the plural forms as well, unless the context clearly indicates otherwise.

Figure 1:
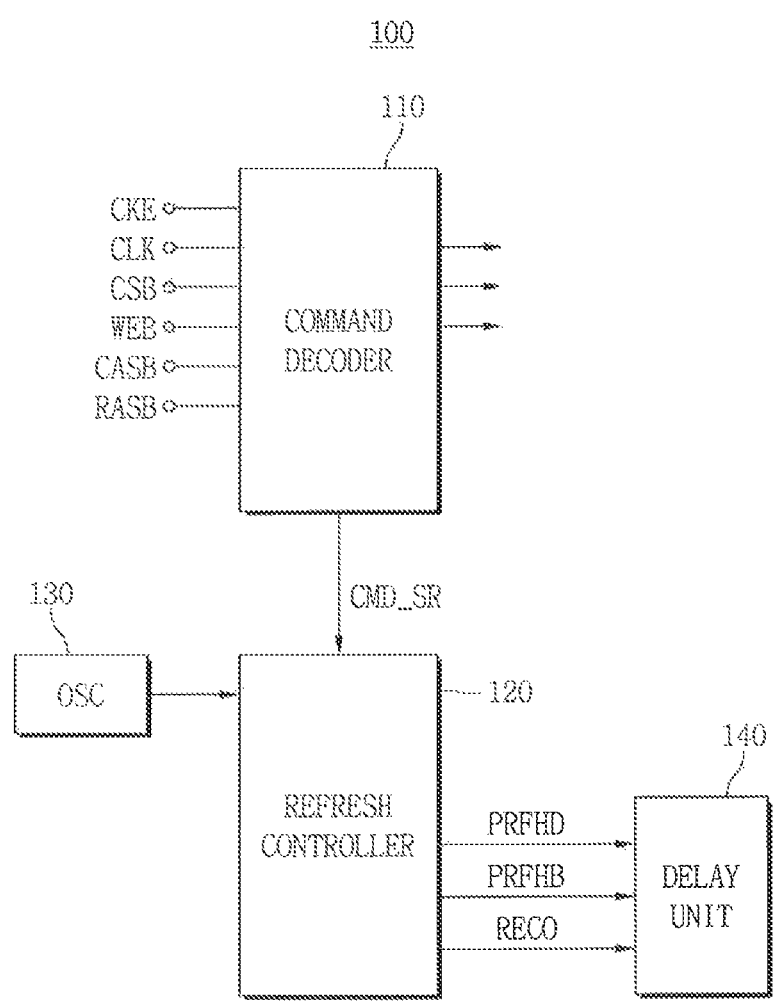
FIG. 1 is a block diagram illustrating a semiconductor memory device, in accordance with an exemplary embodiment of the inventive concept.

FIG. 1 is a block diagram illustrating a semiconductor memory device 100, in accordance with an exemplary embodiment of the inventive concept.

Referring to FIG. 1, the semiconductor memory device 100 may include a command decoder 110, a refresh controller 120, an oscillator 130 and a delay unit 140. Further, the semiconductor memory device 100 may include a row decoder, a column decoder and a memory cell array (not shown).

The command decoder 110 may receive a clock enable signal CKE, a clock signal CLK, a chip selection signal CSB, a write enable signal WEB, a column address strobe signal CASB and a row address strobe signal RASB. These signals may be received from outside the command decoder 110. The command decoder 110 may generate various commands and control signals which are used to operate the semiconductor memory device 100 using the write enable signal WEB, the column address strobe signal CASB and the row address strobe signal RASB.

The oscillator 130 generates an oscillation signal. The refresh controller 120 receives a self-refresh command CMD_SR from the command decoder 110, and receives the oscillation signal from the oscillator 130. The refresh controller 120 generates refresh control signals PRFHD and PRFHB and a recovery signal RECO based on the self refresh command CMD_SR and the oscillation signal. Further, the refresh controller 120 may generate a self refresh active command and a self refresh address to control a memory cell array during a refresh period (not shown). The delay unit 140 may transition internal nodes included in the delay unit 140 that are not transitioned during a refresh period in response to the refresh control signals PRFHD and PRFHB and the recovery signal RECO.

The semiconductor memory device 100 may prevent the generation of negative bias temperature instability (NBTI) in p-channel metal-oxide-semiconductor (PMOS) transistors included in the delay unit 140 based on the refresh control signals PRFHD and PRFHB which are not transitioned during the refresh period. In other words, the NBTI may be lessened by using the refresh control signals PRFHD and PRFHB.

According to an exemplary embodiment of the inventive concept, the refresh control signals PRFHD and PRFHB and the recovery signal RECO may be generated in a self refresh mode.

The semiconductor memory device 100 of FIG. 1 may include volatile memory devices such as a dynamic random access memory (DRAM) or a static random access memory (SRAM), non-volatile memory devices such as a flash memory, a phase change memory, a magnetic random access memory (MRAM), or a resistive random access memory (RRAM), or a combination thereof.

Figure 2:
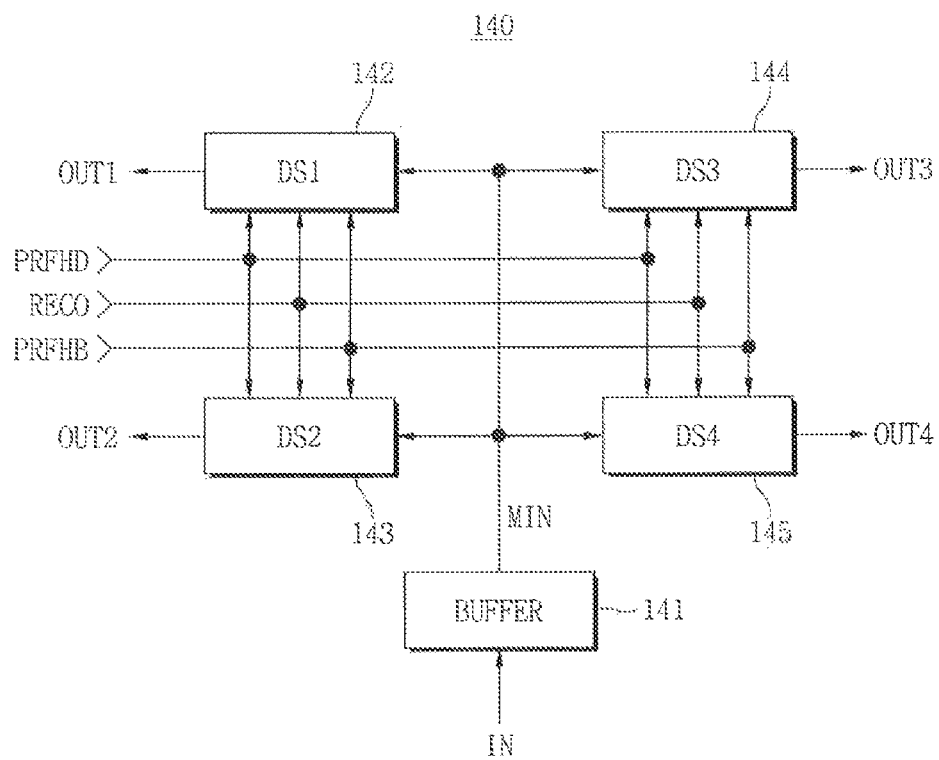
FIG. 2 is a block diagram illustrating a delay unit included in the semiconductor memory device of FIG. 1, according to an exemplary embodiment of the inventive concept.

FIG. 2 is a block diagram illustrating the delay unit 140 included in the semiconductor memory device 100 of FIG. 1, according to an exemplary embodiment of the inventive concept.

Referring to FIG. 2, the delay unit 140 may include a buffer circuit 141 and a plurality of delay segments 142, 143, 144 and 145 having nodes that transition in response to the refresh control signals PRFHD and PRFHB and the recovery signal RECO. The buffer circuit 141 receives and buffers a first input signal IN to generate a second input signal MIN. Each of the delay segments 142, 143, 144 and 145 delays the second input signal MIN and generates output signals OUT1, OUT2, OUT3 and OUT4. Each of the delay segments 142, 143, 144 and 145 may electrically connect one of its internal nodes to a ground voltage during a refresh period. Each of the delay segments 142, 143, 144 and 145 may electrically connect one of its internal nodes located near an input terminal to the ground voltage during the refresh period.

Figure 3:
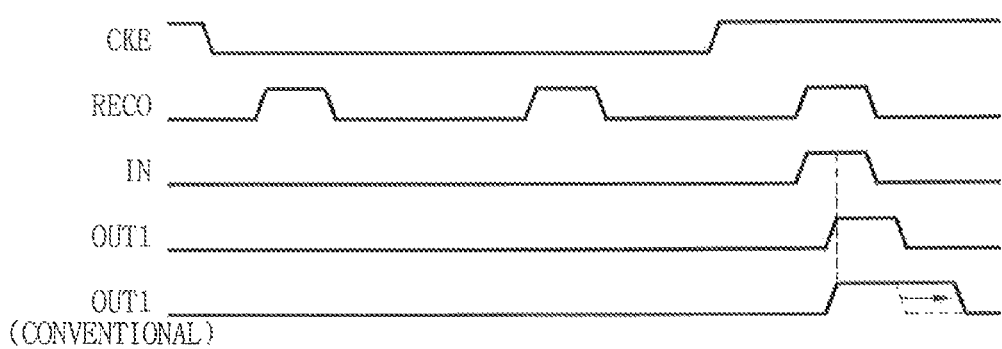
FIG. 3 is a timing diagram illustrating a relationship between a recovery signal, an input signal and an output signal according to an exemplary embodiment of the inventive concept, as well as a conventional output signal.
Figure 4:
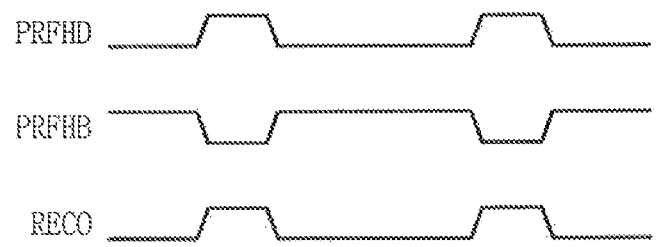
FIG. 4 is a timing diagram illustrating a relationship between a recovery signal, a first refresh control signal and a second refresh control signal, according to an exemplary embodiment of the inventive concept.

FIG. 3 is a timing diagram illustrating a relationship between a recovery signal RECO, an input signal IN and an output signal OUT1 according to an exemplary embodiment of the inventive concept, as well as a conventional output signal, and FIG. 4 is a timing diagram illustrating a relationship between a recovery signal RECO, a first refresh control signal PRFHD and a second refresh control signal PRFHB according to an exemplary embodiment of the inventive concept.

Referring to FIG. 3, the semiconductor memory device 100 may perform a refresh operation when the clock enable signal CKE is kept in a logic low state. The recovery signal RECO may be generated based on refresh information, and is periodically generated when the clock enable signal CKE is in the logic low state. The semiconductor memory device 100 may electrically connect at least one of the internal nodes in the delay unit 140 to the ground voltage in response to the recovery signal RECO during the refresh period, thereby the semiconductor memory device 100 may prevent a high electric field from being applied to the gates of the PMOS transistors comprising inverters included in the delay unit 140. The high electric field may be kept from being applied to the gates of the PMOS transistors for a long time. Therefore, the semiconductor memory device 100 may prevent the NBTI from occurring in the PMOS transistors. However, in a conventional semiconductor memory device, it can be seen that an output signal OUT1 (CONVENTIONAL) cannot follow the input signal IN, and thus the pulse width of the output signal OUT1 (CONVENTIONAL) becomes large compared to the output signal OUT1 of the delay unit 140 according to an exemplary embodiment of the inventive concept.

Referring to FIG. 4, the second refresh control signal PRFHB may have an opposite phase of the first refresh control signal PRFHD, and the recovery signal RECO may have the same phase as the first refresh control signal PRFHD.

Figure 5:
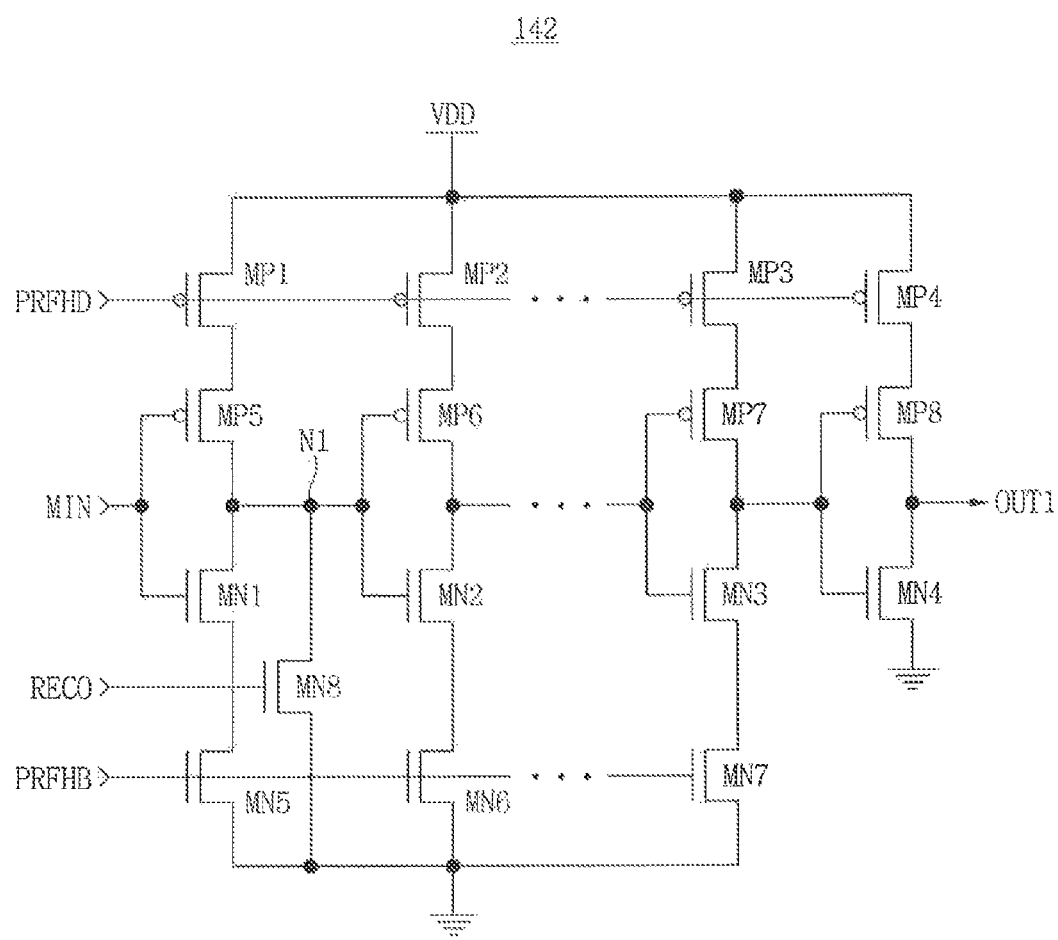
FIG. 5 is a circuit diagram illustrating a delay segment included in the delay unit of FIG. 2, according to an exemplary embodiment of the inventive concept.

FIG. 5 is a circuit diagram illustrating a delay segment 142 included in the delay unit 140 of FIG. 2, according to an exemplary embodiment of the inventive concept.

Referring to FIG. 5, the delay segment 142 may include a plurality of inverters connected to each other in a chain form, a plurality of PMOS transistors MP1, MP2, MP3 and MP4, a plurality of n-channel metal-oxide-semiconductor (NMOS) transistors MN5, MN6 and MN7, and a first switch. Each of the plurality of PMOS transistors MP1, MP2, MP3 and MP4 is connected to a supply voltage VDD and each of the inverters, and performs a switching operation in response to a first refresh control signal PRFHD. Each of the plurality of NMOS transistors MN5, MN6 and MN7 is connected to a ground voltage and each of the inverters, and performs a switching operation in response to a second refresh control signal PRFHB. The first switch may transition some nodes located between the inverters in response to the recovery signal RECO.

The first inverter includes a PMOS transistor MP5 and an NMOS transistor MN1, the second inverter includes a PMOS transistor MP6 and an NMOS transistor MN2, the third inverter includes a PMOS transistor MP7 and an NMOS transistor MN3, and the fourth inverter includes a PMOS transistor MP8 and an NMOS transistor MN4. The input signal MIN is applied to the first inverter, and the output signal OUT1 is output from the fourth inverter.

In FIG. 5, as an example of the first switch, an NMOS transistor MN8 that electrically connects a first node N1 to the ground voltage in response to the recovery signal RECO is shown. In the delay segment 142, the PMOS transistors MP1, MP2, MP3 and MP4 connected to the supply voltage VDD and the NMOS transistors MN5, MN6 and MN7 connected to the ground voltage are inactivated during the refresh period. In other words, the delay segment 142 may perform a power gating operation.

In the delay segment 142, when the PMOS transistors MP1, MP2, MP3 and MP4 connected to the supply voltage VDD and the NMOS transistors MN5, MN6 and MN7 connected to the ground voltage are inactivated during the refresh period, the internal nodes in the delay segment 142 may enter a state of high impedance, and become unstable. The delay segment 142 may electrically connect the first node N1 to the ground voltage by turning on the NMOS transistor MN8 in response to the recovery signal RECO during the refresh period. Therefore, a gate of the PMOS transistor MP6 of the second inverter may be electrically connected to the ground voltage, and the generation of NBTI may be prevented.

Additional, PMOS transistor, inverter and NMOS transistor circuit lines may be arranged between the circuit line including the transistors MP2, MP6, MN2 and MN6 and the circuit line including the transistors MP3, MP7, MN3, MN7, for example.

Figure 6:
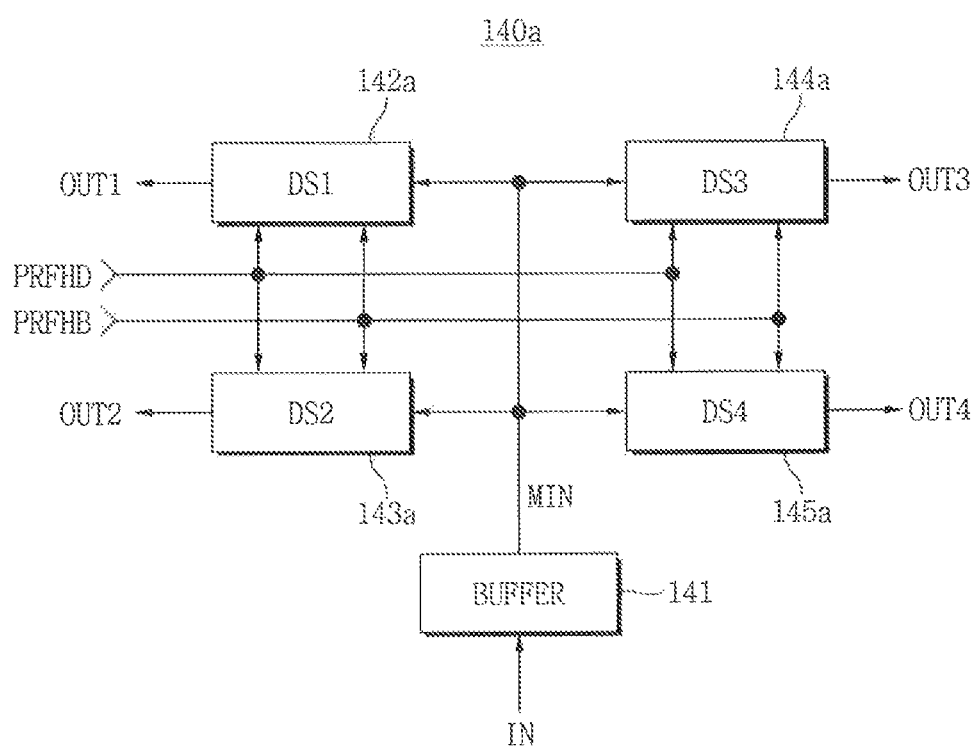
FIG. 6 is a block diagram illustrating a delay unit included in the semiconductor memory device of FIG. 1, according to an exemplary embodiment of the inventive concept.

FIG. 6 is a block diagram illustrating a delay unit 140a included in the semiconductor memory device 100 of FIG. 1, according to an exemplary embodiment of the inventive concept.

Referring to FIG. 6, the delay unit 140a may include a buffer circuit 141 and a plurality of delay segments 142a, 143a, 144a and 145a having nodes that transition in response to the refresh control signals PRFHD and PRFHB. The buffer circuit 141 receives and buffers a first input signal IN to generate a second input signal MIN. Each of the delay segments 142a, 143a, 144a and 145a delays the second input signal MIN and generates output signals OUT1, OUT2, OUT3 and OUT4. Each of the delay segments 142a, 143a, 144a and 145a may electrically connect one of its internal nodes to a ground voltage during a refresh period. Each of the delay segments 142a, 143a, 144a and 145a may electrically connect one of its internal nodes located near an input terminal to the ground voltage during the refresh period.

Figure 7:
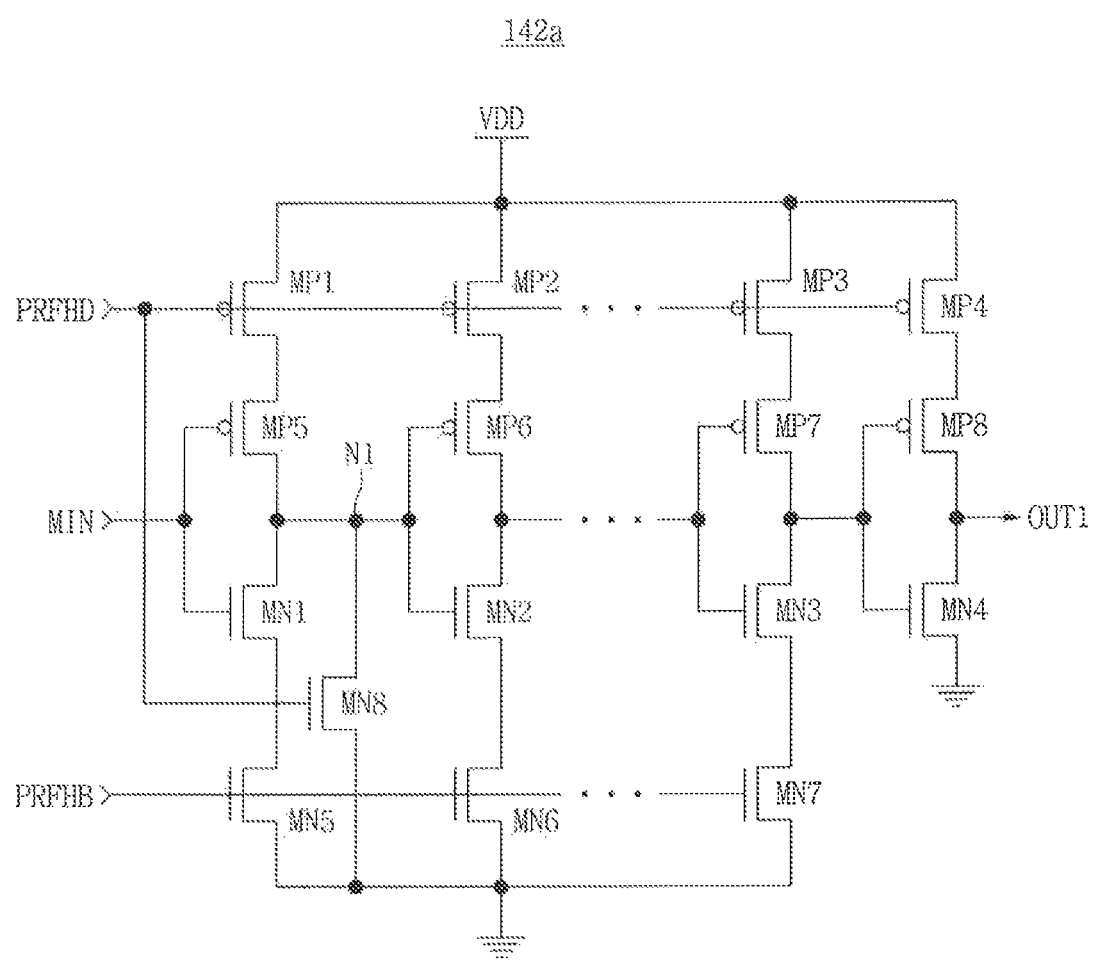
FIG. 7 is a circuit diagram illustrating a delay segment included in the delay unit of FIG. 6, according to an exemplary embodiment of the inventive concept.

FIG. 7 is a circuit diagram illustrating a delay segment 142a included in the delay unit 140 of FIG. 6, according to an exemplary embodiment of the inventive concept.

Referring to FIG. 7, the delay segment 142a may include a plurality of inverters connected to each other in a chain form, a plurality of PMOS transistors MP1, MP2, MP3 and MP4, a plurality of NMOS transistors MN5, MN6 and MN7, and a first switch. Each of the plurality of PMOS transistors MP1, MP2, MP3 and MP4 is connected to a supply voltage VDD and each of the inverters, and performs a switching operation in response to a first refresh control signal PRFHD. Each of the plurality of NMOS transistors MN5, MN6 and MN7 is connected to a ground voltage and each of the inverters, and performs a switching operation in response to a second refresh control signal PRFHB. The first switch may transition some nodes located between the inverters in response to the first refresh control signal PRFHD.

The first inverter includes a PMOS transistor MP5 and an NMOS transistor MN1, the second inverter includes a PMOS transistor MP6 and an NMOS transistor MN2, the third inverter includes a PMOS transistor MP7 and an NMOS transistor MN3, and the fourth inverter includes a PMOS transistor MP8 and an NMOS transistor MN4. The input signal MIN is applied to the first inverter, and the output signal OUT1 is output from the fourth inverter.

In FIG. 7, as an example of the first switch, an NMOS transistor MN8 that electrically connects a first node N1 to the ground voltage in response to the first refresh control signal PRFHD is shown. In the delay segment 142a, the PMOS transistors MP1, MP2, MP3 and MP4 connected to the supply voltage VDD and the NMOS transistors MN5, MN6 and MN7 connected to the ground voltage are inactivated during the refresh period. In other words, the delay segment 142a may perform a power gating operation.

In the delay segment 142a, when the PMOS transistors MP1, MP2, MP3 and MP4 connected to the supply voltage VDD and the NMOS transistors MN5, MN6 and MN7 connected to the ground voltage are inactivated during the refresh period, the internal nodes in the delay segment 142a may enter a state of high impedance, and become unstable. The delay segment 142a may electrically connect the first node N1 to the ground voltage by turning on the NMOS transistor MN8 in response to the first refresh control signal PRFHD during the refresh period. Therefore, a gate of the PMOS transistor MP6 of the second inverter may be electrically connected to the ground voltage, and the generation of NBTI may be prevented.

Additional, PMOS transistor, inverter and NMOS transistor circuit lines may be arranged between the circuit line including the transistors MP2, MP6, MN2 and MN6 and the circuit line including the transistors MP3, MP7, MN3, MN7, for example.

Figure 8:
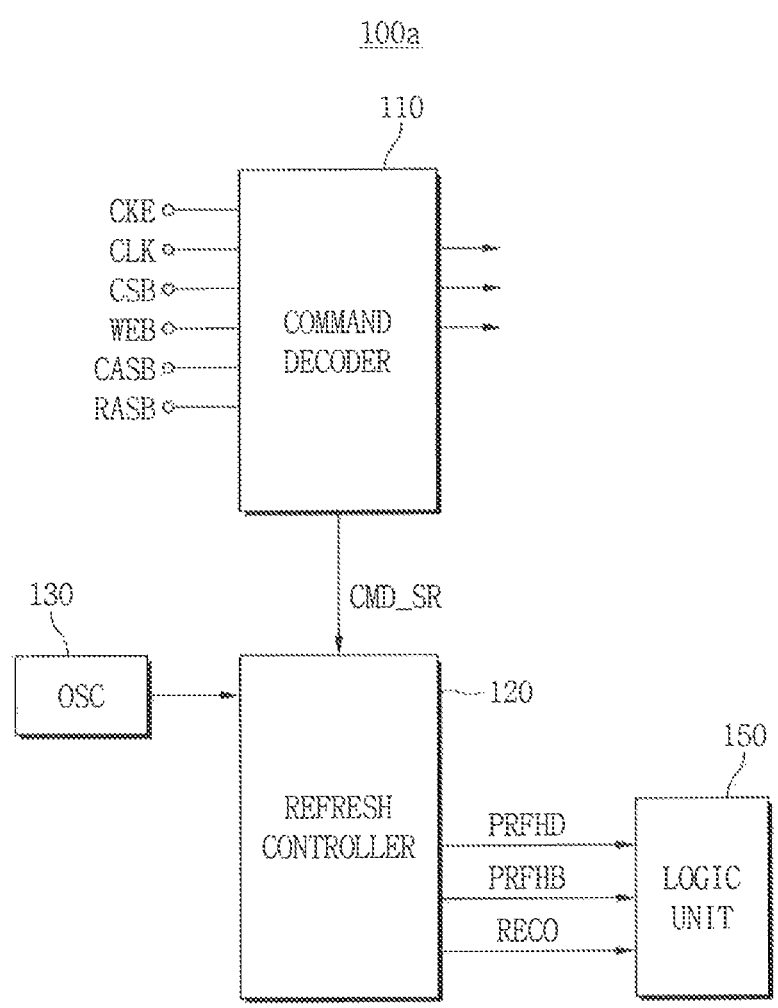
FIG. 8 is a block diagram illustrating a semiconductor memory device, in accordance with an exemplary embodiment of the inventive concept.

FIG. 8 is a block diagram illustrating a semiconductor memory device 100a, in accordance with an exemplary embodiment of the inventive concept.

Referring to FIG. 8, the semiconductor memory device 100a may include a command decoder 110, a refresh controller 120, an oscillator 130 and a logic unit 150.

As described above referring to FIG. 1, the command decoder 110 may generate various commands and control signals which are used to operate the semiconductor memory device 100a using the write enable signal WEB, the column address strobe signal CASB and the row address strobe signal RASB. The command decoder 110 may receive the write enable signal WEB, the column address strobe signal CASB, and the row address strobe signal RASB, as well as the clock enable signal CKE, the clock signal CLK, and the chip selection signal CSB from the outside.

The oscillator 130 generates an oscillation signal. The refresh controller 120 receives a self-refresh command CMD_SR from the command decoder 110, and receives the oscillation signal from the oscillator 130. The refresh controller 120 generates refresh control signals PRFHD and PRFHB and a recovery signal RECO based on the self refresh command CMD_SR and the oscillation signal. Further, the refresh controller 120 may generate a self refresh active command and a self refresh address to control a memory cell array during a refresh period (not shown). The logic unit 150 may transition internal nodes included in the logic unit 150 that are not transitioned during a refresh period in response to the refresh control signals PRFHD and PRFHB and the recovery signal RECO.

The semiconductor memory device 100a may prevent the generation of NBTI in PMOS transistors included in the logic unit 150 based on the refresh control signals PRFHD and PRFHB which are not transitioned during the refresh period.

Figure 9:
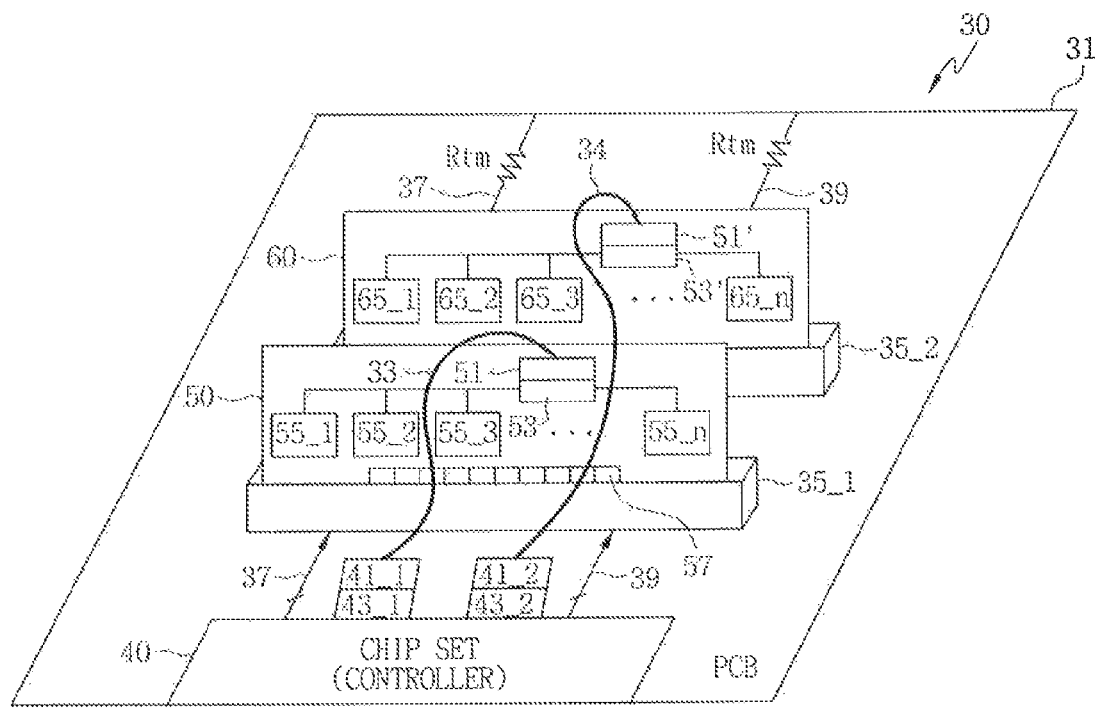
FIG. 9 is a diagram of a memory system including a semiconductor memory device in accordance with an exemplary embodiment of the inventive concept.

FIG. 9 is a diagram of a memory system 30 including a semiconductor memory device in accordance with an exemplary embodiment of the inventive concept.

Referring to FIG. 9, the memory system 30 may include a motherboard 31, a chip set (or a controller) 40, slots 35_1 and 35_2, memory modules 50 and 60, and transmission lines 33 and 34. Buses 37 and 39 may connect the chip set 40 to the slots 35_1 and 352. A terminal resistor Rtm may terminate each of the buses 37 and 39 on a printed circuit board (PCB) of the motherboard 31.

For convenience, in FIG. 9, only two slots 35_1 and 35_2 and two memory modules 50 and 60 are shown. However, the memory system 30 may include additional (or fewer) slots and memory modules.

The chip set 40 may be mounted on the PCB of the motherboard 31, and control an operation of the memory system 30. The chip set 40 may include connectors 41_1 and 41_2 and converters 43_1 and 43_2.

The converter 43_1 may receive parallel data generated by the chip set 40, convert the parallel data to serial data, and output the serial data to the transmission line 33 via the connector 41_1. The converter 43_1 may receive serial data via the transmission line 33 through the connector 41_1, convert the serial data to parallel data, and output the parallel data to the chip set 40.

The converter 43_2 may receive parallel data generated by the chip set 40, convert the parallel data to serial data, and output the serial data to the transmission line 34 via the connector 41_2. The converter 43_2 may receive serial data via the transmission line 34 through the connector 41_2, convert the serial data to parallel data, and output the parallel data to the chip set 40. The transmission lines 33 and 34 included in the memory system 30 may be a plurality of optical fibers.

The memory module 50 may include a plurality of memory devices 55_1 to 55_n, a first connector 57, a second connector 51, and a converter 53. The memory module 60 may include a plurality of memory devices 65_1 to 65_n, a first connector 57' (not shown), a second connector 51', and a converter 53'.

The first connector 57 may transfer low-speed signals received from the chip set 40 to the memory devices 55_1 to 55_n, and the second connector 51 may be connected to the transmission line 33 for transferring high-speed signals.

The converter 53 may receive serial data via the second connector 51, convert the serial data to parallel data, and output the parallel data to the memory devices 55_1 to 55_n. Further, the converter 53 may receive parallel data from the memory devices 55_1 to 55_n, convert the parallel data to serial data, and output the serial data to the second connector 51. The second converter 51' may operate similar to the second converter 51 and the converter 53' may operate similar to the converter 53.

The memory devices 55_1 to 55_n and 65_1 to 65_n may include a semiconductor memory device according to an exemplary embodiment of the inventive concept. Therefore, the memory devices 55_1 to 55_n and 65_1 to 65_n may prevent NBTI by using self refresh information in a refresh mode. The memory devices 55_1 to 55_n and 65_1 to 65_n may be volatile memory devices such as a DRAM or a SRAM, non-volatile memory devices such as a flash memory, a phase change memory, a MRAM, or a RRAM, or a combination thereof.

Figure 10:
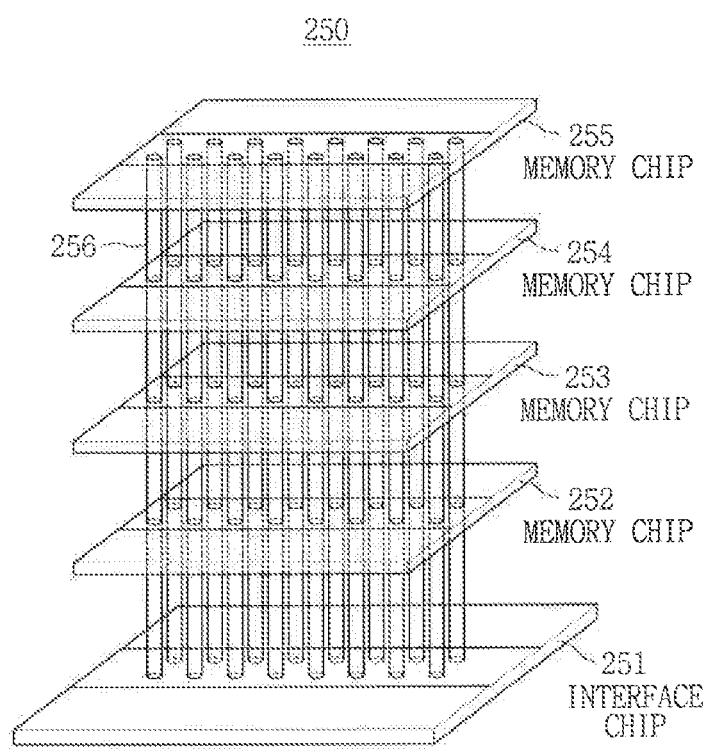
FIG. 10 is a perspective view of a stacked semiconductor device including a semiconductor memory device in accordance with an exemplary embodiment of the inventive concept.

FIG. 10 is a perspective view of a stacked semiconductor device 250 including a semiconductor memory device in accordance with an exemplary embodiment of the inventive concept.

Referring to FIG. 10, the stacked semiconductor device 250 may include an interface chip 251, and memory chips 252, 253, 254 and 255 which are electrically connected through through-silicon via electrodes 256. Although the through-silicon via electrodes 256 disposed in two rows are shown in FIG. 10, the stacked semiconductor device 250 may include any number of the through-silicon via electrodes 256. Further, although four memory chips are shown in FIG. 10, the stacked semiconductor device 250 may include any number of memory chips.

The memory chips 252, 253, 254 and 255 included in the stacked semiconductor device 250 may include a refresh circuit according to an exemplary embodiment of the inventive concept. The interface chip 251 may perform an interface between the memory chips 252, 253, 254 and 255 and external devices.

Figure 11:
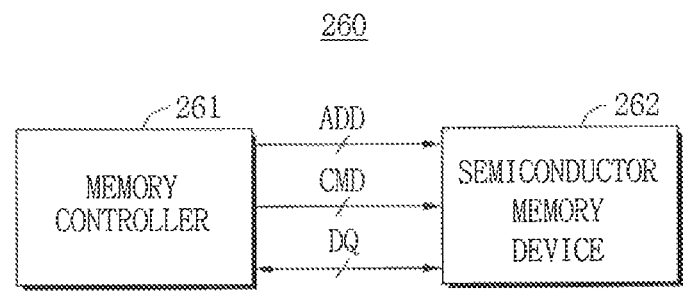
FIG. 11 is a block diagram of a memory system including a semiconductor memory device in accordance with an exemplary embodiment of the inventive concept.

FIG. 11 is a block diagram of a memory system 260 including a semiconductor memory device in accordance with an exemplary embodiment of the inventive concept.

Referring to FIG. 1, the memory system 260 may include a memory controller 261 and a semiconductor memory device 262.

The memory controller 261 may generate address signals ADD and command signals CMD, and provide the address signals ADD and the command signals CMD to the semiconductor memory device 262 through buses. Data DQ may be transmitted from the memory controller 261 to the semiconductor memory device 262 through the buses, or transmitted from the semiconductor memory device 262 to the memory controller 261 through the buses.

The semiconductor memory device 262 may include a semiconductor memory device according to an exemplary embodiment of the inventive concept.

Figure 12:
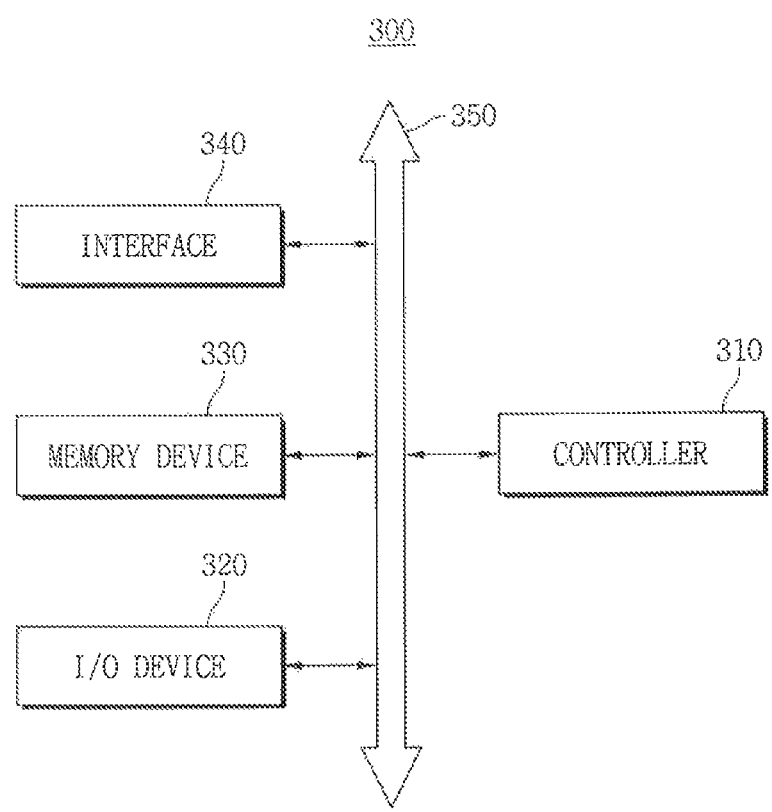
FIG. 12 is a block diagram illustrating an electronic system including a semiconductor memory device in accordance with an exemplary embodiment of the inventive concept.

FIG. 12 is a block diagram illustrating an electronic system 300 including a semiconductor memory device in accordance with an exemplary embodiment of the inventive concept.

Referring to FIG. 12, the electronic system 300 in accordance with the present exemplary embodiment of the inventive concept may include a controller 310, an input and output (I/O) device 320, a memory device 330, an interface 340 and a bus 350. The memory device 330 may include a semiconductor memory device in accordance with an exemplary embodiment of the inventive concept. The bus 350 may function to provide a path in which data is mutually transferred among the controller 310, the I/O device 320, the memory device 330 and the interface 340.

The controller 310 may include at least any one of logic devices that can perform functions of at least one of a microprocessor, a digital signal processor, and a microcontroller, or functions similar to those. The I/O device 320 may include at least one selected from a keypad, a keyboard, and a display device. The memory device 330 may function to store data and/or instructions performed by the controller 310.

The memory device 330 may include volatile memory devices, such as a DRAM or a SRAM, non-volatile memory devices, such as a flash memory, a phase change memory, a MRAM, or a RRAM, or a combination thereof. The memory device 330 may prevent the generation of NBTI in PMOS transistors based on the refresh control signals.

The interface 340 may function to transmit/receive data to/from a communication network. The interface 340 may include an antenna, wired or wireless transceivers, or the like, to transmit and receive data either wired or wirelessly. In addition, the interface 340 may include optical fibers to transmit and receive data through the optical fibers. The electronic system 300 may be further provided with an application chipset, a camera image processor, and an I/O device.

The electronic system 300 may be a mobile system, a personal computer, an industrial computer, or a logic system that may perform various functions. For example, the mobile system may be a personal digital assistant (PDA), a portable computer, a web tablet, a mobile phone, a wireless phone, a laptop computer, a memory card, a digital music system, or an information transmitting/receiving system. If the electronic system 300 is an apparatus that can perform wireless communication, the electronic system 300 may be used in a communication system employing a technique such as Code Division Multiple Access (CDMA), Global System for Mobile communication (GSM), North American Digital Cellular (NADC), Enhanced-Time Division Multiple Access (E-TDMA), Wideband Code Division Multiple Access (WCDMA), or CDMA 2000.

Figure 13:
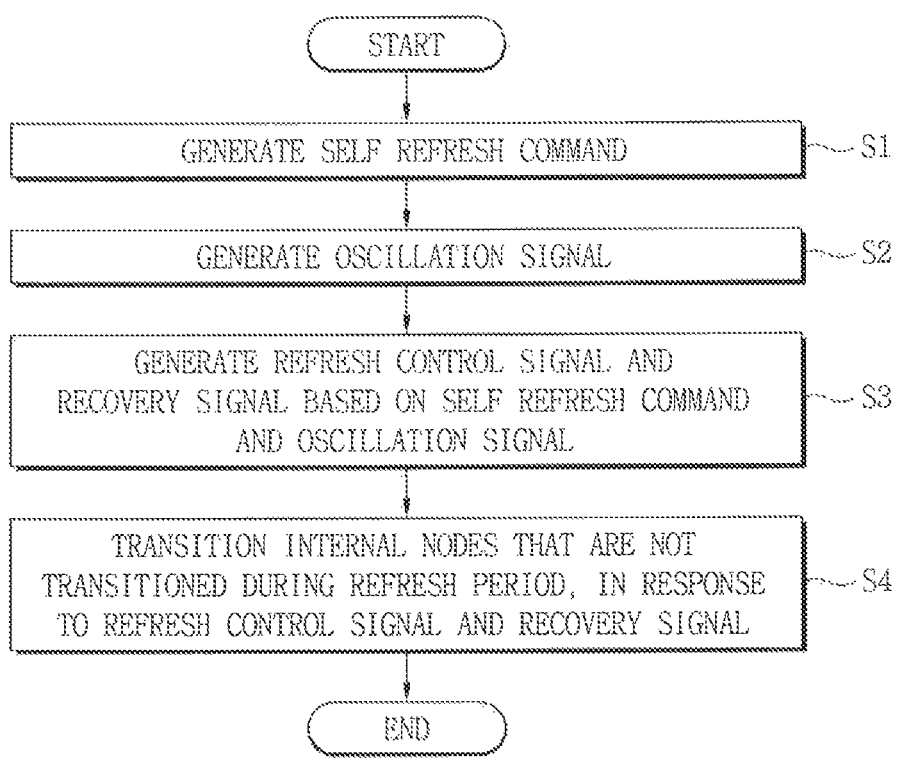
FIG. 13 is a flowchart illustrating a method of decreasing negative bias temperature instability (NBTI) of a semiconductor memory device, in accordance with an exemplary embodiment of the inventive concept.

FIG. 13 is a flowchart illustrating a method of decreasing NBTI of a semiconductor memory device, in accordance with an exemplary embodiment of the inventive concept.

Referring to FIG. 13, the method of decreasing NBTI of a semiconductor memory device in accordance with an exemplary embodiment of the inventive concept may include the following operations:
 (1) generating a self refresh command (S1),
 (2) generating an oscillation signal (S2),
 (3) generating a refresh control signal and a recovery signal based on the self refresh command and the oscillation signal (S3), and
 (4) transitioning internal nodes that are not transitioned during a refresh period, in response to the refresh control signal and the recovery signal (S4).

The method of FIG. 13 may be performed by the semiconductor memory devices 100 and 100a shown in FIGS. 1 and 8, for example.

Figure 14:
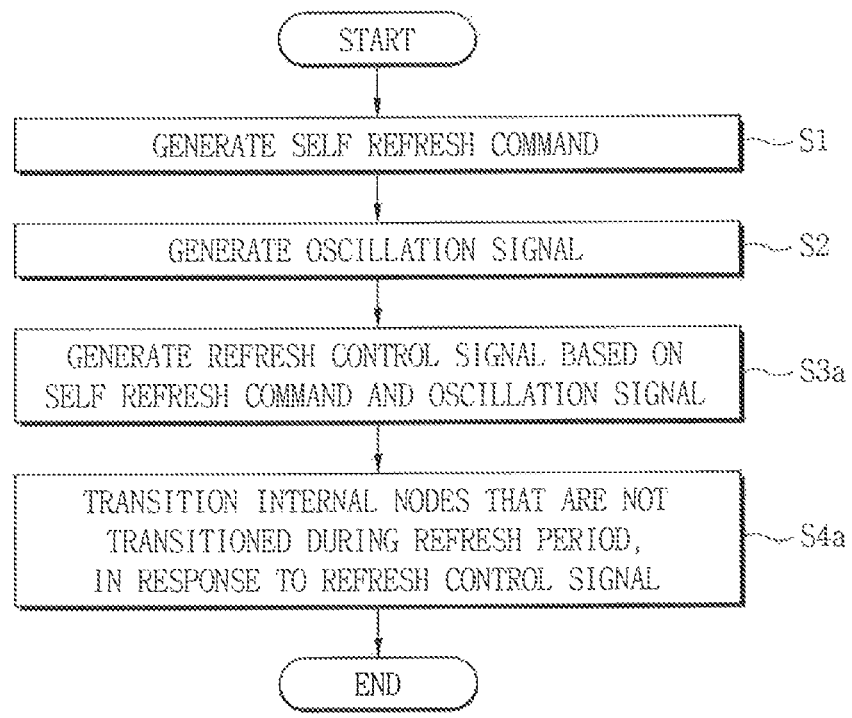
FIG. 14 is a flowchart illustrating a method of decreasing NBTI of a semiconductor memory device, in accordance with an exemplary embodiment of the inventive concept.

FIG. 14 is a flowchart illustrating a method of decreasing NBTI of a semiconductor memory device, in accordance with an exemplary embodiment of the inventive concept.

Referring to FIG. 14, the method of decreasing NBTI of a semiconductor memory device in accordance with an exemplary embodiment of the inventive concept may include the following operations:
 (1) generating a self refresh command (S1),
 (2) generating an oscillation signal (S2),
 (3) generating a refresh control signal based on the self refresh command and the oscillation signal (S3a), and
 (4) transitioning internal nodes that are not transitioned during a refresh period, in response to the refresh control signal (S4a).

The method of FIG. 14 may be performed by the semiconductor memory devices 100 and 100a shown in FIGS. 1 and 8, for example.

According to an exemplary embodiment of the inventive concept, a semiconductor memory device can prevent NBTI from occurring by removing conditions that may cause the generation of NBTI by using self refresh information in a refresh mode. Therefore, the semiconductor memory device can have a high operating speed and high performance.

Exemplary embodiments of the inventive concept may be applied to a semiconductor memory device and, and a memory system including the semiconductor memory device.

While the inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor memory device, comprising:
   a command decoder configured to generate a self refresh command;
   an oscillator configured to generate an oscillation signal;
   a refresh controller configured to generate a refresh control signal and a recovery signal in response to the self refresh command and the oscillation signal; and
   a delay unit configured to transition voltage levels of internal nodes included in the delay unit during a refresh period, in response to the refresh control signal and the recovery signal.

2. The device according to claim 1, wherein the refresh control signal is not transitioned during the refresh period.

3. The device according to claim 1, wherein the refresh control signal and the recovery signal are generated in a self refresh mode.

4. The device according to claim 1, wherein the delay unit includes a plurality of delay segments each having internal nodes whose voltage levels transition in response to the refresh control signal and the recovery signal.

5. The device according to claim 4, wherein each of the plurality of delay segments is configured to electrically connect one of its internal nodes to a ground voltage during the refresh period.

6. The device according to claim 4, wherein each of the plurality of delay segments is configured to electrically connect an internal node located near an input terminal to a ground voltage during the refresh period.

7. The device according to claim 4, wherein each of the plurality of delay segments comprises:
   a plurality of inverters connected to each other in a chain form;
   a plurality of p-channel metal-oxide-semiconductor (PMOS) transistors connected to a supply voltage and each of the inverters, and configured to perform a switching operation in response to a first refresh control signal;
   a plurality of n-channel metal-oxide-semiconductor (NMOS) transistors connected to a ground voltage and each of the inverters, and configured to perform a switching operation in response to a second refresh control signal; and
   a first switch configured to transition voltage levels of some internal nodes located between the inverters in response to the recovery signal.

8. The device according to claim 7, wherein the first switch includes an NMOS transistor connected between one internal node located between the inverters and the ground voltage, and configured to perform a switching operation in response to the recovery signal.

9. The device according to claim 7, wherein the first refresh control signal and the second refresh control signal have opposite phases with respect to each other.

10. The device according to claim 7, wherein the recovery signal has the same phase as the first refresh control signal.

11. A semiconductor memory device, comprising:
    a command decoder configured to generate a self refresh command;
    an oscillator configured to generate an oscillation signal;
    a refresh controller configured to generate a refresh control signal in response to the self refresh command and the oscillation signal; and
    a delay unit configured to transition voltage levels of internal nodes included in the delay unit during a refresh period, in response to the refresh control signal.

12. The device according to claim 11, wherein the delay unit is configured to perform a power gating operation in response to the refresh control signal in the refresh period.

13. The device according to claim 11, wherein the delay unit includes a plurality of delay segments each having internal nodes whose voltage levels transition in response to the refresh control signal.

14. The device according to claim 13, wherein each of the plurality of delay segments comprises:
    a plurality of inverters connected to each other in a chain form;
    a plurality of p-channel metal-oxide-semiconductor (PMOS) transistors connected to a supply voltage and each of the inverters, and configured to perform a switching operation in response to a first refresh control signal;
    a plurality of n-channel metal-oxide-semiconductor (NMOS) transistors connected to a ground voltage and each of the inverters, and configured to perform a switching operation in response to a second refresh control signal; and
    a first switch configured to transition voltage levels of some of internal nodes located between the inverters in response to the first refresh control signal.

15. The device according to claim 14, wherein the first switch includes an NMOS transistor connected between one internal node located between the inverters and the ground voltage, and configured to perform a switching operation in response to the first refresh control signal.

16. A semiconductor memory device, comprising:
    a refresh controller configured to generate a refresh control signal and a recovery signal in response to a self refresh command and an oscillation signal; and
    a delay unit configured to electrically connect at least one of its internal nodes to a ground voltage in response to the recovery signal during a refresh period.

17. The device of claim 16, wherein the delay unit includes a plurality of inverters including p-channel metal-oxide-semiconductor (PMOS) transistors.

18. The device of claim 16, wherein the refresh control signal includes a first refresh control signal and a second refresh control signal having different phases from each other.

19. The device of claim 18, wherein the first refresh control signal is input to p-channel metal-oxide-semiconductor (PMOS) transistors of the delay unit and the second refresh control signal is input to n-channel metal-oxide-semiconductor (NMOS) transistors of the delay unit.

20. The device of claim 16, wherein the internal node that is connected to the ground voltage is disposed between a pair of inverters of the delay unit.

* * * * *